(12) United States Patent
Ding

(10) Patent No.: US 12,700,830 B2
(45) Date of Patent: Aug. 4, 2026

(54) COMMON MODE VOLTAGE DYNAMIC MODULATION CIRCUIT, METHOD THEREOF AND CLASS-D AUDIO POWER AMPLIFIER

(71) Applicant: Suzhou ACME Semi Co.Ltd., Suzhou (CN)

(72) Inventor: Shuangxi Ding, Shanghai (CN)

(73) Assignee: Suzhou ACME Semi Co.Ltd., Suzhou (CN)

( * ) Notice: Subject to any disclaimer, the term of this patent is extended or adjusted under 35 U.S.C. 154(b) by 59 days.

(21) Appl. No.: 18/259,397

(22) PCT Filed: Dec. 27, 2022

(86) PCT No.: PCT/CN2022/142396
§ 371 (c)(1),
(2) Date: Jun. 27, 2023

(87) PCT Pub. No.: WO2023/155600
PCT Pub. Date: Aug. 24, 2023

(65) Prior Publication Data
US 2024/0405722 A1 Dec. 5, 2024

(30) Foreign Application Priority Data

Feb. 18, 2022 (CN) .......................... 202210151485.9

(51) Int. Cl.
*H03F 1/02* (2006.01)
*H03F 1/34* (2006.01)
(Continued)

(52) U.S. Cl.
CPC ............. *H03F 1/0205* (2013.01); *H03F 1/34* (2013.01); *H03F 3/187* (2013.01); *H03F 3/217* (2013.01);
(Continued)

(58) Field of Classification Search
CPC .... H03F 1/0205; H03F 3/217; H03F 2200/03; H03F 3/187; H03F 1/34; H03F 3/45475; H03G 3/301
(Continued)

(56) References Cited

U.S. PATENT DOCUMENTS 7,800,437 B2 * 9/2010 Khoury ................. H03F 3/2173
330/10
9,301,046 B1 * 3/2016 Das .......................... H04R 3/04
(Continued)

FOREIGN PATENT DOCUMENTS

CN 113179089 A * 7/2021 ............... H03F 3/20

*Primary Examiner* — Andrea Lindgren Baltzell
*Assistant Examiner* — Lance Torbjorn Bartol

(57) ABSTRACT
The disclosure provides a common mode voltage dynamic modulation circuit, a method thereof and a class-D audio power amplifier. The modulation circuit includes: a signal input terminal and a common mode voltage dynamic adjustment module. The signal input terminal is used to receive an audio signal and output a differential audio signal to the common mode voltage dynamic adjustment module. The common mode voltage dynamic adjustment module is used to dynamically adjust a common mode voltage of the differential audio signal according to a preset static common mode bias and a normalized processing result of a swing of the audio signal, track an amplitude of an input audio signal in real time and obtain a continuously adjusted common mode voltage.

13 Claims, 8 Drawing Sheets

(51) Int. Cl.

| | | |
|---|---|---|
| *H03F 3/187* | (2006.01) |
| *H03F 3/217* | (2006.01) |
| *H03F 3/45* | (2006.01) |
| *H03G 3/30* | (2006.01) |

(52) U.S. Cl.
CPC ......... *H03F 3/45475* (2013.01); *H03G 3/301* (2013.01); *H03F 2200/03* (2013.01)

(58) Field of Classification Search
USPC ....................................................... 330/251
See application file for complete search history.

(56) References Cited

U.S. PATENT DOCUMENTS

| | | | | |
|---|---|---|---|---|
| 10,027,294 B2 * | 7/2018 | Wang | ...................... | H03F 3/185 |
| 2008/0191802 A1 * | 8/2008 | Kinget | ............... | H03F 3/45071 |
| | | | | 330/253 |
| 2010/0128912 A1 * | 5/2010 | Schiller | ................... | H03G 7/08 |
| | | | | 330/254 |

* cited by examiner

COMMON MODE VOLTAGE DYNAMIC MODULATION CIRCUIT, METHOD THEREOF AND CLASS-D AUDIO POWER AMPLIFIER

TECHNICAL FIELD

The disclosure relates to the technical field of power electronics, in particular to a common mode voltage dynamic modulation circuit, a method thereof and a class-D audio power amplifier.

BACKGROUND

The purpose of the audio power amplifier is to reproduce the input audio signal on the sound output component, provide the required volume and power level, and ensure high reproduction efficiency and low distortion. In the face of this task, Class-D audio amplifiers show many advantages, especially compared with Class-A/B power amplifiers, the efficiency is significantly improved. However, in the case of medium or high power requiring higher voltage, it is necessary to add a set of LC filters to filter the switching signal at the output stage of the class-D audio power amplifier to reduce EMI (Electro Magnetic Interference). Losses due to inductor ripple current at high voltages are a major component of static power dissipation.

In traditional Class-D audio power amplifier PWM (pulse width modulation, PWM for short) modulation technology, the common mode of PWM modulation is fixed to ½ of the full swing of the triangular wave generator. In this way, the duty cycle of the output common mode is 50%, the common mode voltage of the output stage of the power amplifier is fixed at PVDD/2 (PVDD is the power supply voltage of the power amplifier), and the output signal swings around ½ of the power supply voltage of the power amplifier. The disadvantages of this are: 1) when there is no music playing in the power amplifier, the inductor ripple current is still very large, and the static power consumption is high; 2) when the volume is small or medium, the signal output swing is limited, and the high common mode voltage leaves too much margin for output signal swing, which is a waste of power consumption.

SUMMARY

The disclosure provides a common mode voltage dynamic modulation circuit, a method thereof and a class-D audio power amplifier.

The disclosure provides a common mode voltage dynamic modulation circuit, which includes a signal input terminal and a common mode voltage dynamic adjustment module.

The signal input terminal is configured to receive an audio signal and output a differential audio signal to the common mode voltage dynamic adjustment module.

The common mode voltage dynamic adjustment module is configured to dynamically adjust a common mode voltage of the differential audio signal according to a preset static common mode bias and a normalized processing result of a swing of the audio signal to obtain a current common mode voltage.

In some embodiments, the common mode voltage dynamic modulation circuit further includes an anti-clipping-off feedback adjustment module, configured to collect the differential audio signal after superimposing the current common mode voltage in real time, and determine a feedback adjustment voltage according to an amplitude of the differential audio signal after superimposing the current common mode voltage. The feedback adjustment voltage is configured to give feedback and adjust the current common mode voltage.

In some embodiments, the common mode voltage dynamic modulation circuit further includes a first adder. The first adder is configured to add the current common mode voltage and the feedback adjustment voltage to obtain a current common mode voltage after the feedback adjustment.

In some embodiments, when the signal input terminal is single-ended, the signal input terminal comprises an inverter to invert the audio signal.

In some embodiments, the common mode voltage dynamic modulation circuit further includes a PWM comparator. The PWM comparator is configured to compare a received preset triangular wave signal with the differential audio signal after superimposing the current common mode voltage, and output an audio PWM modulation signal.

In some embodiments, the common mode voltage dynamic modulation circuit further includes a second adder and a third adder.

The second adder is configured to superimpose a positive terminal signal of the differential audio signal and the current common mode voltage, and output the positive terminal signal of the differential audio signal after superimposing the current common mode voltage.

The third adder is configured to superimpose a negative terminal signal of the differential audio signal and the current common mode voltage, and output the negative terminal signal of the differential audio signal after superimposing the current common mode voltage.

In some embodiments, the preset static common mode bias is a real number greater than 0 and less than or equal to 0.5.

The disclosure further provides a dynamic modulation method of the common mode voltage. The method is configured to a dynamic adjustment of the common mode voltage using the common mode voltage dynamic modulation circuit according to any one of the above-mentioned common mode voltage dynamic modulation circuit. The method includes:

receiving an audio signal and outputting a differential audio signal;

normalizing the swing of the differential audio signal through the common mode voltage adjustment module, and determining the current common mode signal according to the obtained normalized input signal and the preset static common mode bias.

In some embodiments, the dynamic modulation method of the common mode voltage further includes: collecting the differential audio signal after superimposing the current common mode signal in real time through an anti-clipping-off feedback adjustment module, determining a feedback adjustment voltage according to the differential audio signal amplitude after superimposing the current common mode signal, and obtaining a current common mode signal after the feedback adjustment.

The disclosure further provides a class-D audio power amplifier. The class-D audio power amplifier includes any one of the above-mentioned common mode voltage dynamic modulation circuit.

In some embodiments, the class-D audio power amplifier further includes an output power amplifier module. An input terminal of the output power amplifier module is connected with an output terminal of the common mode voltage dynamic modulation circuit.

In some embodiments, the class-D audio power amplifier further includes a low-pass filter. The low-pass filter is connected with an output terminal of the output power amplifier module.

In some embodiments, the common mode voltage dynamic modulation circuit further includes a power amplifier gain module. An input terminal of the power amplifier gain module is connected with an output terminal of a signal input module, and an output terminal of the power amplifier gain module is connected with an input terminal of the common mode voltage dynamic adjustment module. An output signal of the output power amplifier module is fed back to the input terminal of the power amplifier gain module.

The disclosure provides the common mode voltage dynamic modulation circuit, the method thereof and the class-D audio power amplifier. The modulation circuit includes: a signal input terminal and a common mode voltage dynamic adjustment module. The signal input terminal is used to receive an audio signal and output a differential audio signal to the common mode voltage dynamic adjustment module. The common mode voltage dynamic adjustment module is used to dynamically adjust a common mode voltage of the differential audio signal according to a preset static common mode bias and a normalized processing result of a swing of the audio signal, track an amplitude of an input audio signal in real time and obtain a continuously adjusted common mode voltage. This circuit may be used in the class-D audio power amplifier to adjust the common mode voltage, so that a PWM duty cycle may be kept at a low value when there is no audio input, which reduces energy consumption. In addition, the common mode voltage is modulated according to the amplitude of the input audio, and the common mode voltage may be always maintained in a state where what you get is what you need. When the power is small or medium, a loss caused by an inductor ripple current may be reduced to a minimum.

Figure 1:
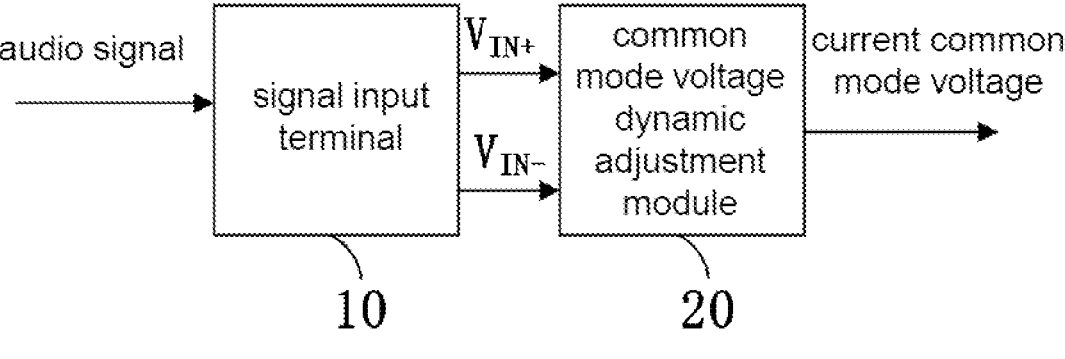
FIG. 1 is a block view of a common mode voltage dynamic modulation circuit composition of an embodiment.

201 (the music signal), (b) is the waveform of node 204, (c) is the waveform of node 205 (the positive terminal output of the differential music signal with superimposed common mode voltage), (d) is the waveform of node 206 (the negative terminal output of the differential music signal after superimposing the common mode voltage), (e) is the waveform of node 207 (the triangular wave signal), (f) is the waveform of node 208 (the PWM signal of the positive terminal output of the class-D power amplifier), (g) is the waveform of node 209 (the PWM signal of a negative terminal output of the class-D power amplifier), and (h) is the final output common mode voltage of nodes 208 and 209, which means that the output common mode voltage of the class-D power amplifier.

Figure 7:
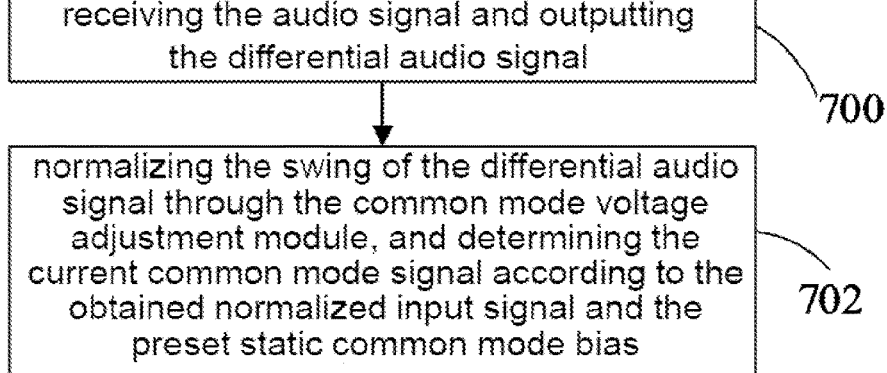

FIG. 7 is a schematic flowchart of a dynamic modulation method of the common mode voltage in an embodiment.

Figure 8:
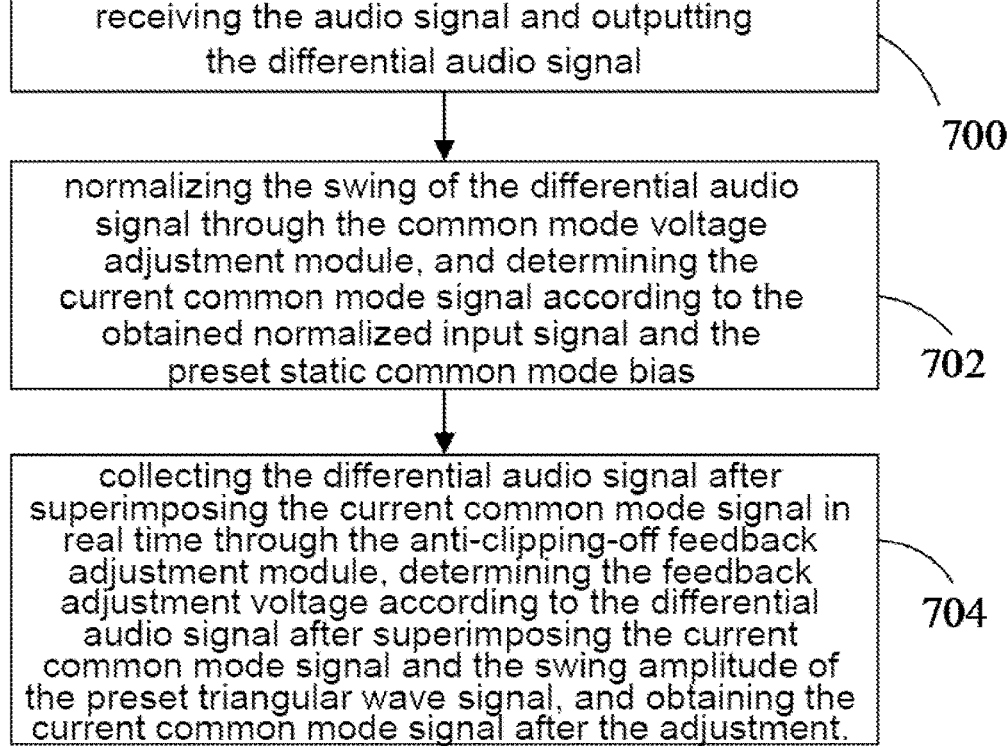

FIG. 8 is a schematic flowchart of a dynamic modulation method of the common mode voltage in another embodiment.

DETAILED DESCRIPTION

In order to enable a purpose, technical solution and advantages of the disclosure to be clearer, the disclosure will be further described in detail below in conjunction with accompanying drawings and embodiments. It should be understood that the specific embodiments described here are only used to explain the disclosure, and are not intended to limit the disclosure.

In an embodiment, please refer to FIG. 1. A common mode voltage dynamic modulation circuit is provided, which includes a signal input terminal 10 and a common mode voltage dynamic adjustment module 20.

The signal input terminal 10 is used to receive an audio signal and output a differential audio signal to the common mode voltage dynamic adjustment module 20. Specifically, the signal input terminal may be a single-ended mode or a differential mode. When the signal input terminal is in the single-ended mode, the signal input terminal 10 will process the received audio signal, convert the single-ended signal into the differential audio signal and output it to the common mode voltage dynamic adjustment module 20.

The common mode voltage dynamic adjustment module 20 is used to dynamically adjust a common mode voltage of the differential audio signal according to a preset static common mode bias and a normalized processing result of a swing of the audio signal and obtain a current common mode voltage.

The current common mode voltage value is obtained through which a normalized voltage swing minus a normalized amplitude of the current input audio signal and the preset static common mode bias which obtains a normalized current common mode voltage, and then the normalized current common mode voltage is multiplied by a normalized voltage reference. A normalized processing voltage reference is an amplitude of the triangular wave signal of the class-D audio power amplifier including the common mode voltage dynamic modulation circuit, and the amplitude of the triangular wave signal is determined according to a power supply PVDD. An expression of the current common mode voltage after normalization is:

$$V_{COM}/V_{TRI}=1-\text{abs}(V_{IN})/V_{TRI}-\alpha;$$

$V_{COM}/V_{TRI}$ is the current common mode voltage after normalization, $\text{abs}(V_{IN})/V_{TRI}$ is the audio signal swing after normalization, $\text{abs}(V_{IN})$ is an absolute value of an input voltage $V_{IN}$, $V_{COM}$ is the current common mode voltage, and $V_{TRI}$ is a maximum voltage of a triangular wave ($V_{peak}$) and α is the preset static common mode bias.

In the common mode voltage dynamic modulation circuit, the modulation circuit includes: a signal input terminal and a common mode voltage dynamic adjustment module. The signal input terminal is used to receive an audio signal and output a differential audio signal to the common mode voltage dynamic adjustment module. The common mode voltage dynamic adjustment module is used to dynamically adjust a common mode voltage of the differential audio signal according to a preset static common mode bias and a normalized processing result of a swing of the audio signal, track an amplitude of an input audio signal in real time and obtain a continuously adjusted common mode voltage. This circuit may be used in the class-D audio power amplifier to adjust the common mode voltage, so that a PWM duty cycle may be kept at a low value when there is no audio input, which reduces energy consumption. In addition, the common mode voltage is modulated according to the amplitude of the input audio, and the modulated common mode voltage may be always maintained in a state where what you get is what you need. When the power is small or medium, a loss caused by an inductor ripple current can be reduced to a minimum.

In some embodiments, the common mode voltage dynamic modulation circuit further includes an anti-clipping-off feedback adjustment module, which is used to collect the differential audio signal after superimposing the current common mode voltage in real time, and determine a feedback adjustment voltage according to an amplitude of the differential audio signal after superimposing the current common mode voltage. The feedback adjustment voltage is used to give feedback and adjust the current common mode voltage.

A purpose of introducing the anti-clipping feedback adjustment module in the common mode voltage dynamic modulation circuit is to perform a feedback and control the current common mode voltage according to the differential audio signal after superimposing the current common mode voltage, so that a full swing of the differential audio signal after superimposing the current common mode voltage is consistent with a swing of the preset triangular wave signal, which prevents a clipping distortion and obtains a current common mode voltage after the feedback adjustment.

In some embodiments, the common mode voltage dynamic modulation circuit further includes a first adder, which is used to add the current common mode voltage and the feedback adjustment voltage to obtain a current common mode voltage after the feedback adjustment.

Specifically, the anti-clipping-off feedback adjustment module collects a differential signal after superimposing the common mode voltage in real time, outputs the feedback adjustment voltage to an input terminal of the first adder, the common mode voltage dynamic adjustment module outputs a current common mode signal to the other input terminal of the first adder, and the first adder outputs the current common mode voltage after the feedback adjustment.

In some embodiments, when the signal input terminal is single-ended, the signal input terminal includes an inverter to invert the audio signal.

In some embodiments, the common mode voltage dynamic modulation circuit further includes a PWM comparator. The PWM comparator is used to compare a received preset triangular wave signal with the differential audio signal after superimposing the current common mode voltage, and output an audio PWM signal.

The PWM comparator includes two comparators. Positive terminals of a first comparator and a second comparator receive a preset triangular wave signal. A negative terminal of the first comparator receives a positive terminal signal of the differential audio signal, a negative terminal of the second comparator receives a negative terminal signal of the differential audio signal and outputs a positive terminal signal and a negative terminal signal of the audio PWM modulation signal.

In some embodiments, the common mode voltage dynamic modulation circuit further includes a second adder and a third adder. The second adder is used to superimpose the positive terminal signal of the differential audio signal and the current common mode voltage, and output the positive terminal signal of the differential audio signal after superimposing the current common mode voltage. The third adder is used to superimpose the negative terminal signal of the differential audio signal and the current common mode voltage, and output the negative terminal signal of the differential audio signal after superimposing the current common mode voltage.

In some embodiments, the preset static common mode bias is a real number greater than 0 and less than or equal to 0.5. In other embodiments, a value range of the preset static common mode bias is: a real number greater than 0 and less than or equal to 0.2.

In an embodiment of the disclosure, the disclosure provides the class-D audio power amplifier. The class-D audio power amplifier includes any of the above current common voltage dynamic modulation circuit.

In some embodiments, the class-D audio power amplifier further includes an output power amplifier module. An input terminal of the output power amplifier module is connected with the output terminal of the common mode voltage dynamic modulation circuit.

The output power amplifier module includes two power amplification branches having a gate driving module and an H-bridge circuit. An output terminal of the gate driving module is connected with an input terminal of the H-bridge circuit. An input terminal of the gate driving module of a first power amplification branch receives the positive terminal signal of the audio PWM modulation signal, and the H-bridge circuit of the first power amplification branch outputs the positive terminal signal of the amplified audio PWM modulation signal. An input terminal of the gate driving module of the second power amplification branch receives the negative terminal signal of the audio PWM modulation signal, and an H-bridge circuit of the second power amplification branch outputs the amplified negative terminal signal of the audio PWM modulation signal.

In some embodiments, the class-D audio power amplifier further includes a low-pass filter. The low-pass filter is connected with an output terminal of the output power amplifier module.

The low-pass filter includes two low-pass LC filters. An input terminal of a first low-pass filter is connected with the output terminal of the H-bridge circuit of the first power amplification branch. An input terminal of a second low-pass filter is connected with the output terminal of the H-bridge circuit of the second power amplification branch. The first low-pass filter and the output terminal of the first low-pass filter output a modulated, amplified and filtered audio signal.

Figure 2:
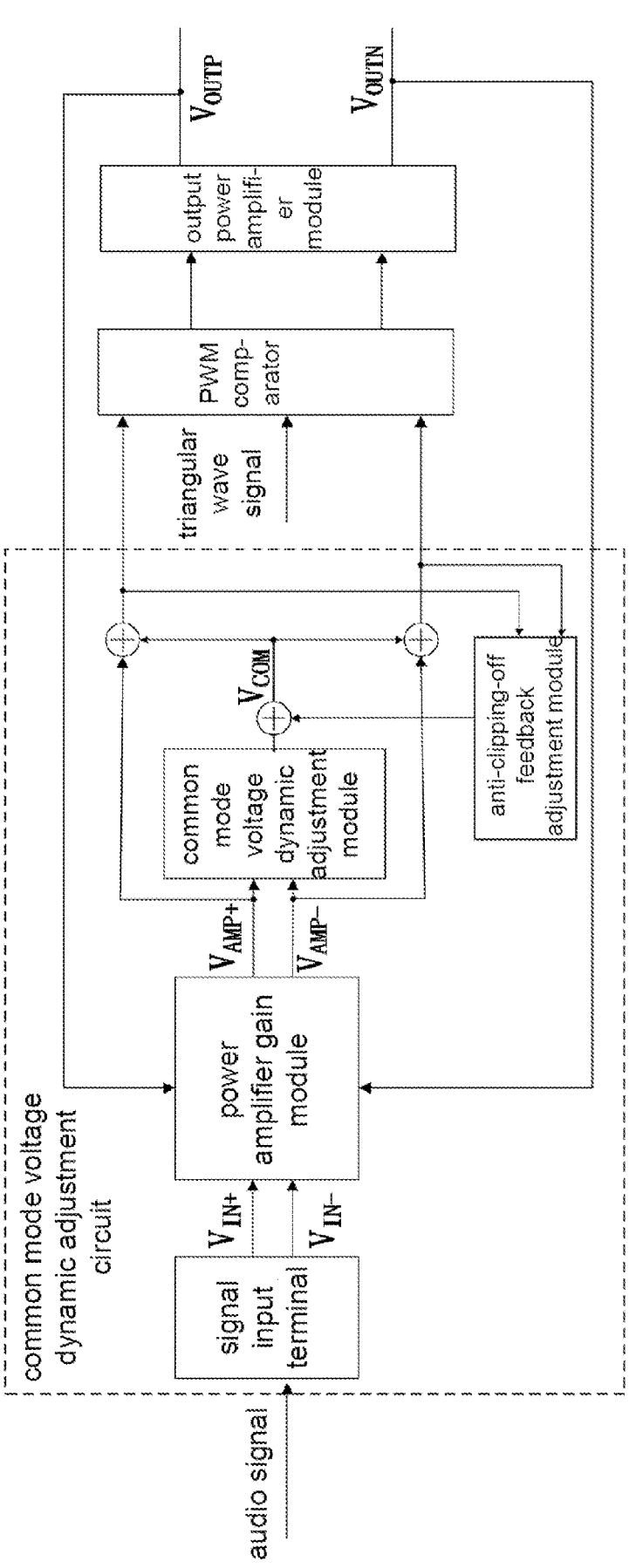
FIG. 2 is a structural block view of a class-D audio power amplifier in another embodiment.

In some embodiments, please refer to FIG. 2. The common mode voltage dynamic modulation circuit in the class-D audio power amplifier further includes a power amplifier gain module. An input terminal of the power amplifier gain module is connected with an output terminal of the signal input module, and an output terminal of the power amplifier gain module is connected with an input terminal of the common mode voltage dynamic adjustment module. An output signal of the output power amplifier module is fed back to the input terminal of the power amplifier gain module.

Figure 3:
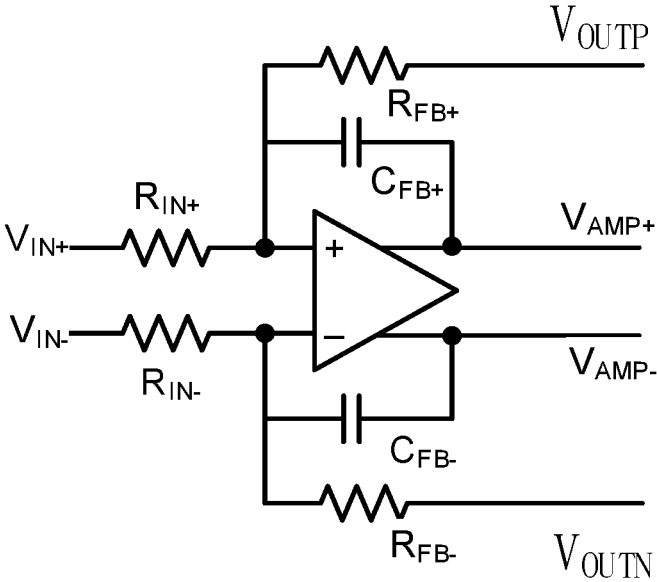
FIG. 3 is a schematic view of a principle of a power amplifier gain module in another embodiment.

Specifically, the power amplifier gain module is a differential negative feedback amplifier, which directly feeds back differential outputs VOUTP and VOUTN of an entire power amplifier to the power amplifier gain module for comparison with the input signal. If the output is distorted, the power amplifier gain module will correct the distortion. Please refer to FIG. 3. The power amplifier gain module includes: an operational amplifier, a positive terminal input resistor $R_{IN+}$, a positive terminal feedback resistor $R_{FB+}$, a positive terminal filter capacitor $C_{FB+}$, a negative terminal input resistor $R_{IN-}$, a negative terminal feedback resistor $R_{FB-}$ and a negative terminal filter capacitor $C_{FB-}$. One end of the positive input resistor $R_{IN+}$ is connected with a positive output terminal of the signal input terminal, the other end of the positive terminal input resistor $R_{IN+}$ is connected with a positive input terminal of the operational amplifier, and one end of the positive terminal feedback resistor $R_{FB+}$ is connected with the positive input terminal of the operational amplifier, and the other end of the positive terminal feedback resistor $R_{FB+}$ is connected with the output positive terminal of the output power amplifier module. One end of the positive terminal filter capacitor $C_{FB+}$ is connected with the positive input terminal of the operational amplifier, and the other end of the positive terminal filter capacitor $C_{FB+}$ is connected with the positive output terminal of the operational amplifier. One end of the negative terminal input resistor $R_{IN-}$ is connected with a negative output terminal of the signal input terminal, the other end of the negative terminal input resistor $R_{IN-}$ is connected with a negative input terminal of the operational amplifier, one end of the negative terminal feedback resistor $R_{FB-}$ is connected with the negative input terminal of the operational amplifier, and the other end of the negative terminal feedback resistor $R_{FB-}$ is connected with a negative output terminal of the output power amplifier module. One end of the negative terminal filter capacitor $C_{FB-}$ is connected with the negative input terminal of the operational amplifier, and the other end of the negative terminal filter capacitor $C_{FB-}$ is connected with a negative output terminal of the operational amplifier.

Figure 4:
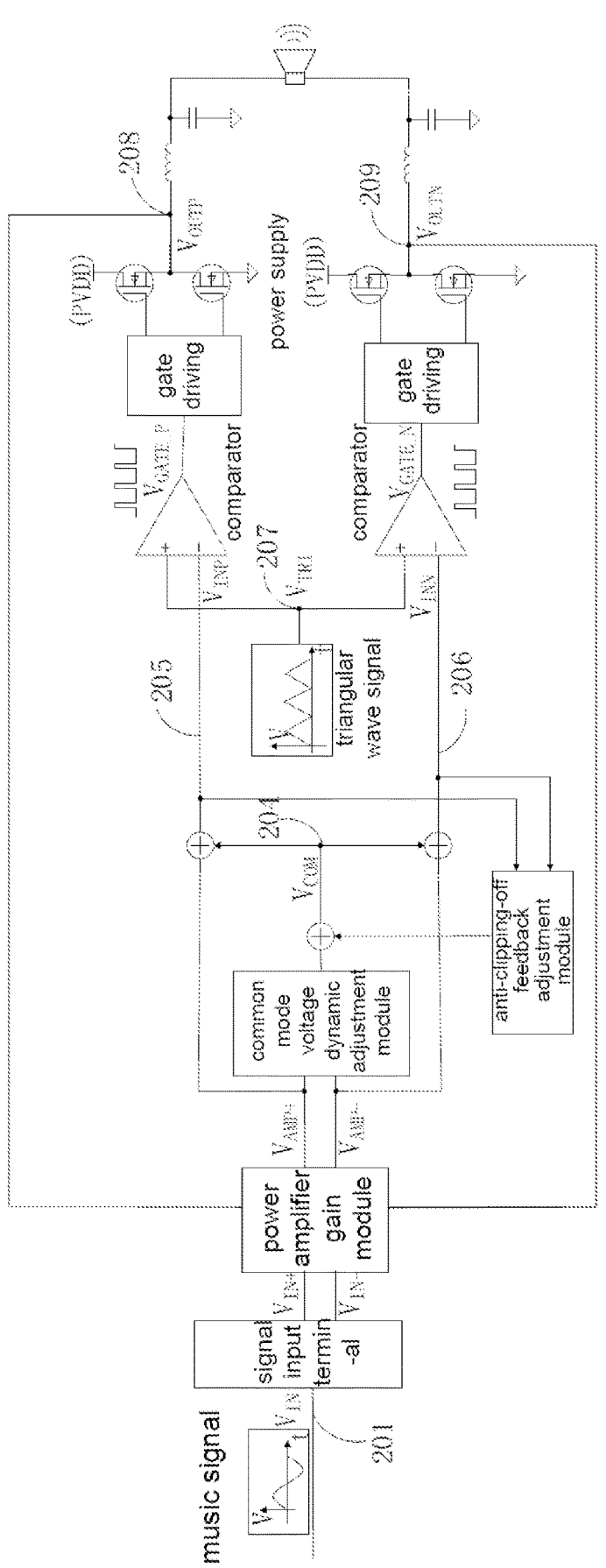
FIG. 4 is a structural block view of the class-D audio power amplifier in another embodiment.

In another embodiment, FIG. 4 is a structural block view of the class-D audio power amplifier. The class-D audio power amplifier includes the signal input terminal, the power amplifier gain module, the common mode voltage dynamic adjustment module, the anti-clipping-off feedback adjustment module, the PWM comparator having two comparators, two power amplification branches having gate driving and H-bridge circuit, and two LC low-pass filters. The signal input terminal outputs the differential audio signal.

A basic principle of the common mode voltage dynamic modulation of the differential audio signal is to adjust the common mode voltage $V_{COM}$ of $V_{INP}$ and $V_{INN}$ in real time according to the swing of the input audio signal. The common mode voltage dynamic modulation is realized by the common mode voltage dynamic adjustment module and the anti-clipping-off feedback adjustment module. The common mode voltage dynamic adjustment module is used to subtract the normalized differential audio signal from an output amplitude of the normalized differential audio signal amplified by the power amplifier gain module and the preset static common mode bias α, and then the current common mode voltage after normalization processing is obtained. An actual value of the current common mode voltage is obtained by multiplying the normalized current common mode voltage by the normalized voltage reference. When the common mode voltage is dynamically adjusted, the preset static common mode bias α is set to prevent an output power module from entering a completely non-working state. The value range of α is: 0<α<0.5. In order to keep full swings of $V_{INP}$ and $V_{INN}$ consistent with the swing of the triangular wave signal (to prevent clipping distortion), an anti-clipping-off feedback adjustment module is introduced for feedback control. The common mode voltage of $V_{INP}$ and $V_{INN}$ is $V_{COM}$, and an amplitude of $V_{COM}$ is a dynamically adjusted value according to a change of an amplitude of the music signal. In this way, when there is no audio signal input, the output duty cycle of $V_{GATE\_P}$ and $V_{GATE\_N}$ is α. Please refer to FIG. 5. In FIG. 5, α is 0.15. Since the output PWM duty cycle of a class-D power amplifier is reduced from 50% to 15%, the inductor ripple current of this embodiment is reduced by 70% compared with the inductor ripple current of the traditional fixed common mode PWM modulation mode, thereby reducing a static power consumption. In addition, under a low or medium power, an output common mode of the power amplifier is always maintained in a state of "what you get is what you need", so under the low or medium power, a loss caused by the inductor ripple current will also be reduced to a minimum. Table 1 shows the signals of each node modulated by dynamic common mode PWM in the class D audio power amplifier. Table 1 shows signals of each node modulated by dynamic common mode PWM in the class-D audio power amplifier. "What you get is what you need" means that by adjusting $V_{COM}$ in real time according to the music signal $V_{IN}$, an output common mode voltage of the class-D power amplifier changes continuously with a change of the input music signal, thereby reducing the ripple current flowing through an output inductor in real time.

TABLE 1

| Signals of dynamic common mode PWM modulation of each node | | | |
| --- | --- | --- | --- |
| Signal node | Common mode voltage | Swing | Remark |
| $V_{IN}$ | 0 | −0.5~0.5 | Normalized value |
| $V_{COM}$ | Determined by $V_{AMP}$ signal and static common mode voltage bias α, and dynamically adjusted by an anti-clipping-off feedback loop | (0.5-α)~(1-α) (α is generally set to 0~0.5) | |
| $V_{INP}$ | $V_{COM}$ | | |
| $V_{INN}$ | $V_{COM}$ | | |
| $V_{TRI}$ | 0.5 | 0~1 | |
| $V_{OUTP}$ | α × PVDD~0.65 × PVDD | 0~PVDD | Voltage value |
| $V_{OUTN}$ | α × PVDD~0.65 × PVDD | 0~PVDD | |

Figures 5A, 5B, 5C, 5D, 5E:
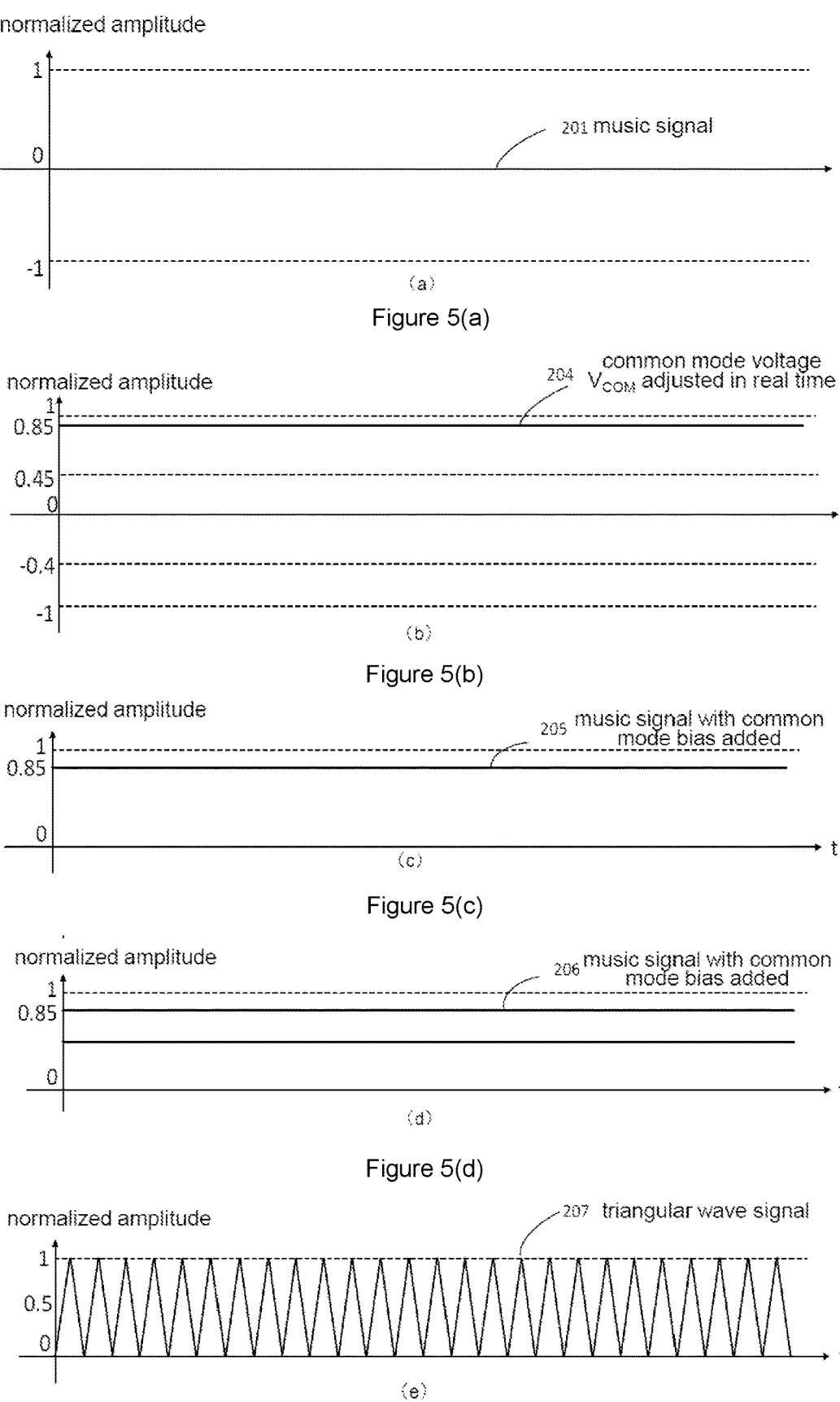
FIG. 5(*a*)-5(*h*) is a signal waveform view of each node of the class-D audio power amplifier in another embodiment (an input audio signal is κ). (a) is a waveform of node 201 (a music signal), (b) is a waveform of node 204, (c) is a waveform of node 205 (a positive terminal output of a differential music signal after superimposing the common mode voltage), (d) is a waveform of node 206 (a negative terminal output of the differential music signal after superimposing the common mode voltage), (e) is a waveform of node 204 (a triangular wave signal), (f) is a waveform of node 208 (a PWM signal of a positive terminal output of a class-D power amplifier), (g) is a waveform of node 209 (a PWM signal of a negative terminal output of the class-D power amplifier), and (h) is a final output common mode voltage of nodes 208 and 209, which means that the output common mode voltage of the class-D power amplifier.
Figures 5F, 5G, 5H, 6A, 6B:
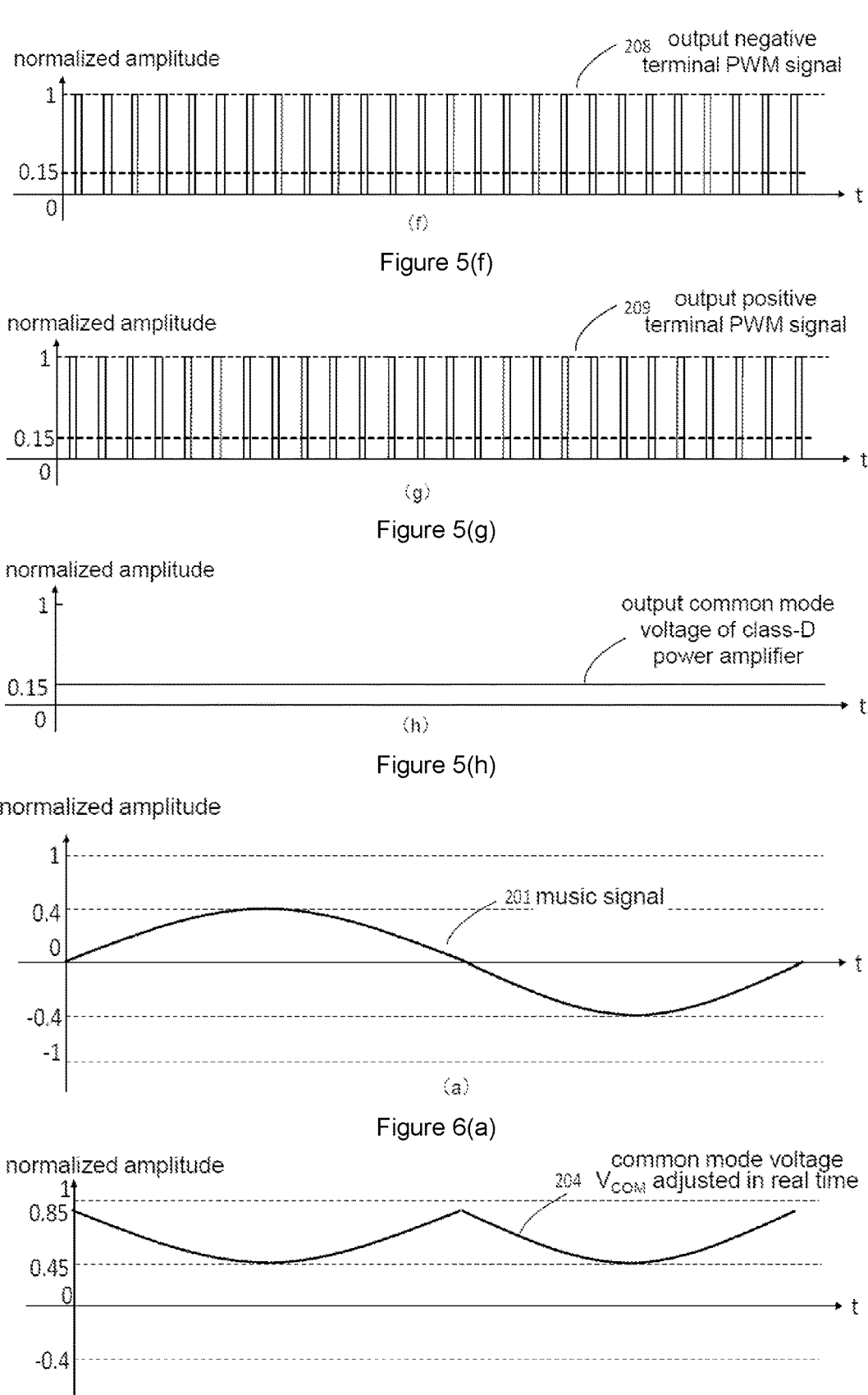
FIG. 6(*a*)-6(*h*) is a schematic view of signals of each node modulated by dynamic common mode PWM (with input signal) in another embodiment. (a) is the waveform of node
Figure 6C:
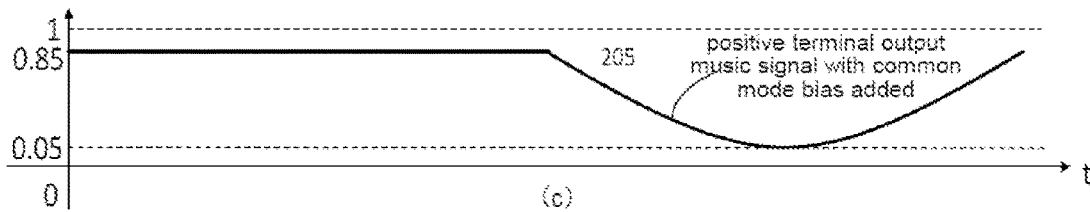
Figure 6D:
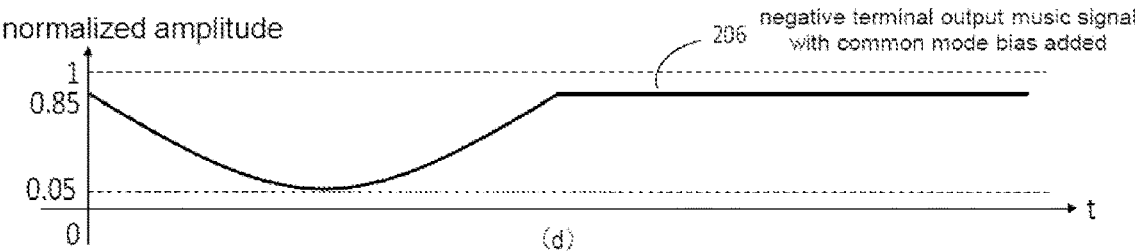
Figure 6E:
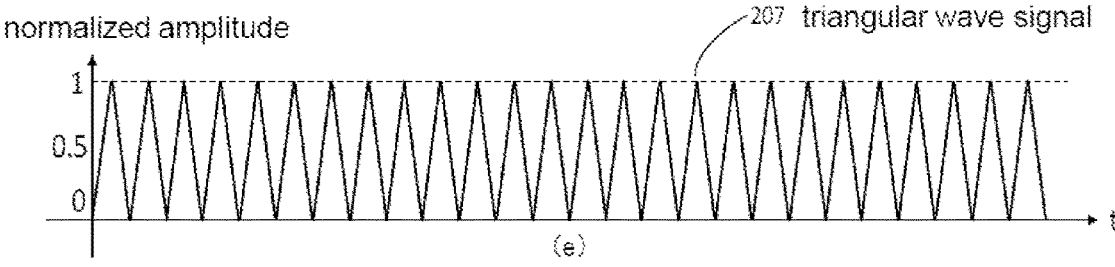
Figure 6F:
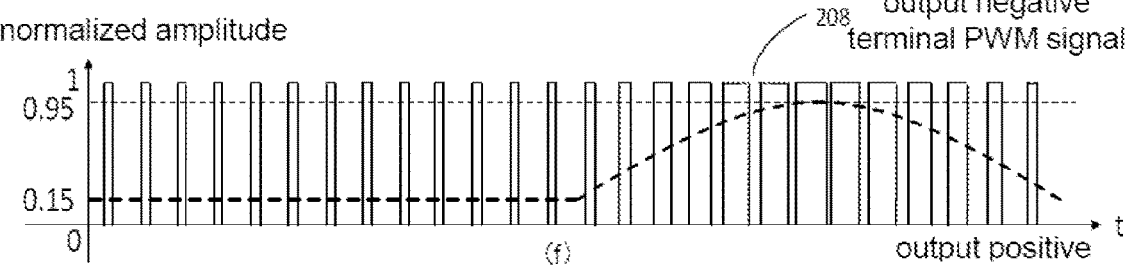
Figure 6G:
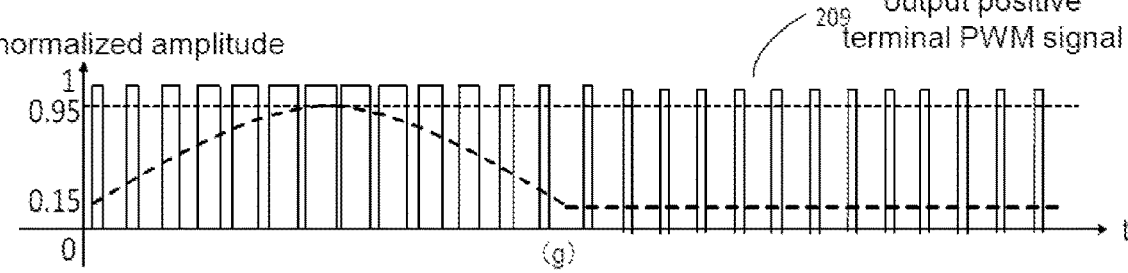
Figure 6H:
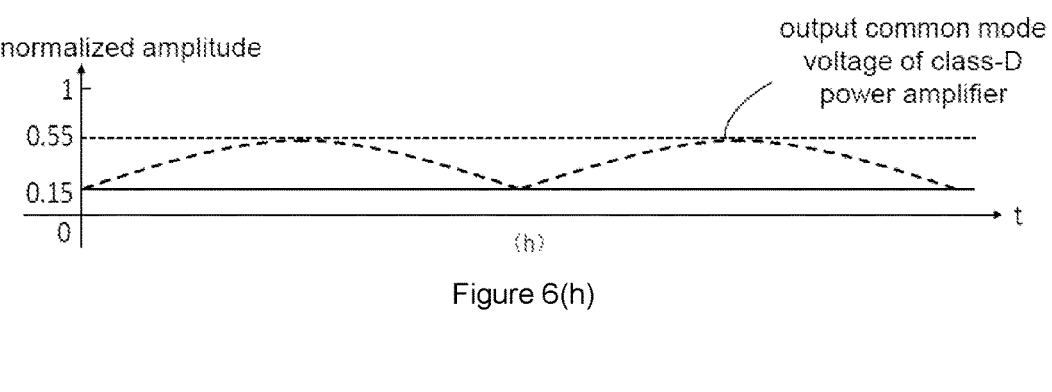

When the input music signal is 0, and, the signals of nodes 201, 205, 206, 207, 208, 209, 204 in FIG. 4 are respectively the music signal, a positive terminal output of differential music signal after superimposing common mode voltage, a negative terminal output of differential music signal after superimposing common mode voltage, the triangular wave signal, the positive terminal signal of audio PWM modulation signal, the negative terminal of audio PWM modulation signal and the output common mode voltage. Normalized amplitude curves of each node signal in FIG. 4 are shown in FIG. 5. FIG. 5(a) is a waveform of node 201 (music signal). The music signal is converted into differential signals $V_{IN+}$ and $V_{IN-}$ after passing through the signal input terminal of the class-D power amplifier. $V_{IN+}$ and $V_{IN-}$ are signals with equal swings and opposite phases. FIG. 5(b) is a waveform of node 204 (common mode voltage $V_{COM}$ adjusted in real time, $V_{COM}$ is calculated according to $V_{COM}/V_{TRI}=1-\text{abs}$ $(V_{IN})/V_{TRI}-\alpha$). FIG. 5(c) is a waveform of node 205 (the positive terminal output of the differential music signal after superimposing the common mode voltage). The common mode voltage dynamic adjustment module in FIG. 4 calculates the current common mode voltage according to the amplitude of the current input audio signal and a common mode bias factor. The anti-clipping-off feedback adjustment module is a negative feedback network, which detects in real time whether the audio signal after superimposing the common mode voltage is less than or equal to 0 or not, and if yes, a positive offset is output. A model of node 204 is a sum of outputs of the common mode voltage dynamic adjustment module and the anti-clipping-off feedback adjustment module. When the input audio signal $V_{IN}$ is 0, the output voltage $V_{COM}$ of the node 204 is $1-\alpha$ (in this embodiment, $\alpha=0.15$, so the output voltage $V_{COM}$ of the node 204 is normalized 0.85). FIG. 5(c) shows a waveform at node 205 (the positive terminal output of the differential music signal after superimposing the common mode voltage). Since the music signal is 0, the normalized value is 0.85 after superimposing the common mode voltage. FIG. 5(d) is a waveform of node 206 (the negative terminal output of the differential music signal after superimposing the common mode voltage). Since the music signal is 0, the normalized value is 0.85 after superimposing the common mode voltage. FIG. 5(e) shows a waveform (triangular wave signal) of node 204. The triangular wave signal is consistent with the current power supply voltage (PVDD) of the class-D power amplifier, so its normalized swing is 1. FIG. 5(f) shows that a waveform of node 208 is a PWM signal of a positive terminal output of the class-D power amplifier. A constant DC voltage signal at node 205 is compared with the triangular wave signal by a comparator, and the duty cycle of the output PWM signal of node 208 is constant at 0.15. FIG. 5(g) is a waveform of node 209 and is a PWM signal of a negative terminal output of class-D power amplifier. A constant DC voltage signal at node 206 is compared with the triangular wave signal by a comparator, and the duty cycle of the output PWM signal of node 209 is constant at 0.15. FIG. 5(h) is the output common mode voltage of class-D power amplifier. The final output common mode voltage of the class-D power amplifier is equal to a swing of the common mode voltage of node 204, and their phases are opposite. The output common mode voltage value of the class-D power amplifier is constant at 0.15. This small duty cycle may keep the inductor ripple current behind at a small value, thereby reducing the static power consumption when not playing music.

When there is a music signal input and $\alpha=0.15$, the normalized amplitude curves of the signals of nodes 201, 205, 206, 207, 208, 209, 204 in FIG. 4 are as shown in FIG. 6. FIG. 6(a) is the waveform of node 201 (music signal). The music signal is converted into differential signals $V_{IN+}$ and $V_{IN-}$ after passing through the signal input terminal of the class-D power amplifier. $V_{IN+}$ and $V_{IN-}$ are signals with equal swings and opposite phases. FIG. 6(b) is the waveform of node 204 (common mode voltage $V_{COM}$ adjusted in real time, $V_{COM}$ is calculated according to $V_{COM}/V_{TRI}=1-\text{abs}$ $(V_{IN})/V_{TRI}-\alpha$). The common mode voltage dynamic adjustment module in FIG. 4 calculates the current common mode voltage according to the amplitude of the current input audio signal and a common mode bias factor. The anti-clipping-off feedback adjustment module is a negative feedback network, which detects in real time whether the audio signal after superimposing the common mode voltage is less than or equal to 0 or not, and if yes, a positive offset for reverse adjustment is output. A model of node 204 is a sum of outputs of the common mode voltage dynamic adjustment module and the anti-clipping-off feedback adjustment module. The waveform of node 204 changes with an absolute value of the input music signal $\text{abs}(V_{IN})$. The greater the absolute value of the music signal, the smaller the common mode voltage value $V_{COM}$, the greater the duty cycle of the PWM signal obtained by comparing the triangle wave signal with the differential audio signal through the comparator, and the higher the common mode voltage output by the class-D power amplifier. Conversely, the smaller the absolute value $\text{abs}(V_{IN})$ of the music signal, the larger the common mode voltage value $V_{COM}$, and the smaller the duty cycle of the PWM signal obtained by comparing the triangular wave signal with the differential audio signal through the comparator, thereby reducing the inductor ripple current in real time to achieve a purpose of saving electricity. FIG. 6(c) shows the waveform at node 205 (the positive terminal output of the differential music signal after superimposing the common mode voltage). FIG. 6(d) is the waveform of node 206 (the negative terminal output of the differential music signal after superimposing the common mode voltage). FIG. 6(e) shows the waveform (triangular wave signal) of node 204. The triangular wave signal is consistent with the current power supply voltage (PVDD) of the class-D power amplifier, so its normalized swing is 1. FIG. 6(f) is the waveform of node 208 (output positive terminal PWM signal), and the waveform of node 205 is compared with the triangular wave signal by a comparator to obtain the duty cycle of the output PWM signal of node 208. FIG. 6(g) is the waveform of node 209 (output negative terminal PWM signal). The waveform at node 206 is compared with the triangular wave signal by a comparator to obtain the duty ratio of the output PWM signal at node 209. FIG. 6(h) is the output common mode voltage of class-D power amplifier. The final output common mode voltage of the class-D power amplifier is equal to a swing of the common mode voltage of node 204, and their phases are opposite. Compared with the output common mode always being maintained at 0.5 of the traditional class-D power amplifier (no matter how big the output music signal is, an average duty cycle of a waveform of an output PWM is 50%), the output common mode in this embodiment changes continuously between 0.15 and 0.55 following the change of the input music signal (the average duty cycle of the waveform of the output PWM will also change between 15% and 55% accordingly, and the average duty cycle of the waveform of the PWM will remain at a small value when outputting low or medium volumes), thereby reducing the ripple current flowing through the output inductor in real time.

In an embodiment, please refer to FIG. 7, the disclosure provides a dynamic modulation method of the common mode voltage. The method is applicable to any of the above-mentioned common mode voltage dynamic modulation circuits to dynamically adjust the common mode voltage. The dynamic modulation method of the common mode voltage includes:

S700: receiving the audio signal and outputting the differential audio signal;

S702: normalizing the swing of the differential audio signal through the common mode voltage adjustment module, and determining the current common mode signal according to the obtained normalized input signal and the preset static common mode bias.

In an embodiment of the disclosure, please refer to FIG. 8. The dynamic modulation method of the common mode voltage further includes S704: collecting the differential audio signal after superimposing the current common mode signal in real time through the anti-clipping-off feedback adjustment module, determining the feedback adjustment voltage according to the differential audio signal amplitude after superimposing the current common mode signal and the swing amplitude of the preset triangular wave signal, and obtaining the current common mode signal after the adjustment.

It should be understood that although the various operations in the flowcharts of FIG. 7 through FIG. 8 are displayed sequentially as indicated by the arrows, these operations are not necessarily executed sequentially in an order indicated by the arrows. Unless specified herein, there is no strict order restriction on an execution of these operations, and these operations may be executed in other orders. Moreover, at least some of the operations in FIG. 7 through FIG. 8 may include multiple sub-operations or multiple stages. These sub-operations or stages are not necessarily executed at the same time, but may be executed at different times. An execution order of these sub-operations or stages is not necessarily performed sequentially, but may be performed by turns or alternately with at least a part of other operations or sub-operations or stages of other operations.

Technical features of the above embodiments may be combined arbitrarily. To make the description concise, all possible combinations of the technical features in the above embodiments are not described. However, as long as there is no contradiction in a combination of these technical features, it should be considered as within a scope of the description.

The above-mentioned embodiments only express several implementation modes of the disclosure, and the description thereof is relatively specific and detailed, but it should not be construed as limiting the scope of the disclosure. It should be noted that those skilled in the art may make several modifications and improvements without departing from the disclosure, and these all belong to a protection scope of the disclosure. Therefore, the protection scope of the disclosure should be based on the appended claims.

What is claimed is:

1. A common mode voltage dynamic modulation circuit, comprising a signal input terminal and a common mode voltage dynamic adjustment module, wherein
   the signal input terminal is configured to receive an audio signal and output a differential audio signal to the common mode voltage dynamic adjustment module;
   the common mode voltage dynamic adjustment module is configured to dynamically adjust a common mode voltage of the differential audio signal according to a preset static common mode bias and a normalized processing result of a swing of the audio signal to obtain a current common mode voltage;
   an expression of the current common mode voltage after normalization is:

$$V_{COM}/V_{TRI}=1-abs(V_{IN})/V_{TRI}-\alpha;$$

$V_{COM}/V_{TRI}$ is the current common mode voltage after normalization, abs $(V_{IN})/V_{TRI}$ is the swing of the audio signal after normalization, abs $(V_{IN})$ is an absolute value of an input voltage $V_{IN}$, $V_{COM}$ is the current common mode voltage, $V_{TRI}$ is a maximum voltage of a triangular wave, and $\alpha$ is the preset static common mode bias.

2. The common mode voltage dynamic modulation circuit according to claim 1, further comprising an anti-clipping-off feedback adjustment module, configured to collect the differential audio signal after superimposing the current common mode voltage in real time, and determine a feedback adjustment voltage according to an amplitude of the differential audio signal after superimposing the current common mode voltage, wherein
   the feedback adjustment voltage is configured to give feedback and adjust the current common mode voltage.

3. The common mode voltage dynamic modulation circuit according to claim 2, further comprising a first adder, wherein
   the first adder is configured to add the current common mode voltage and the feedback adjustment voltage to obtain a current common mode voltage after the feedback adjustment.

4. The common mode voltage dynamic modulation circuit according to claim 1, wherein
   when the signal input terminal is single-ended, the signal input terminal comprises an inverter to invert the audio signal.

5. The common mode voltage dynamic modulation circuit according to claim 1, further comprising a PWM comparator, wherein
   the PWM comparator is configured to compare a received preset triangular wave signal with the differential audio signal after superimposing the current common mode voltage, and output an audio PWM modulation signal.

6. The common mode voltage dynamic modulation circuit according to claim 1, further comprising a second adder and a third adder, wherein
   the second adder is configured to superimpose a positive terminal signal of the differential audio signal and the current common mode voltage, and output the positive terminal signal of the differential audio signal after superimposing the current common mode voltage;
   the third adder is configured to superimpose a negative terminal signal of the differential audio signal and the current common mode voltage, and output the negative terminal signal of the differential audio signal after superimposing the current common mode voltage.

7. The common mode voltage dynamic modulation circuit according to claim 1, wherein
   the preset static common mode bias is a real number greater than 0 and less than or equal to 0.5.

8. A dynamic modulation method of a common mode voltage, configured to a dynamic adjustment of the common mode voltage using the common mode voltage dynamic modulation circuit according to claim 1, comprising:
   receiving the audio signal and outputting the differential audio signal;
   normalizing the swing of the differential audio signal through the common mode voltage adjustment module, and determining the current common mode signal according to the obtained normalized input signal and the preset static common mode bias.

9. The dynamic modulation method of the common mode voltage according to claim 8, further comprising:
   collecting the differential audio signal after superimposing the current common mode signal in real time through an anti-clipping-off feedback adjustment module, determining a feedback adjustment voltage according to an amplitude of the differential audio signal after superimposing the current common mode signal, and obtaining a current common mode signal after the determining the feedback adjustment voltage.

10. A class-D audio power amplifier, comprising the common mode voltage dynamic modulation circuit according to claim 1.

11. The class-D audio power amplifier according to claim 10, further comprising an output power amplifier module, wherein an input terminal of the output power amplifier module is connected with an output terminal of the common mode voltage dynamic modulation circuit.

12. The class-D audio power amplifier according to claim 11, further comprising a low-pass filter, wherein the low-pass filter is connected with an output terminal of the output power amplifier module.

13. The class-D audio power amplifier according to claim 11, further comprising a power amplifier gain module;

an input terminal of the power amplifier gain module is connected with an output terminal of a signal input module, and an output terminal of the power amplifier gain module is connected with an input terminal of the common mode voltage dynamic adjustment module;

an output signal of the output power amplifier module is fed back to the input terminal of the power amplifier gain module.

* * * * *